United States Patent
Wild

(10) Patent No.: US 10,658,401 B2
(45) Date of Patent: May 19, 2020

(54) CARRIER RELEASE

(71) Applicant: FLEXENABLE LIMITED, Cambridge (GB)

(72) Inventor: Barry Wild, Cambridge (GB)

(73) Assignee: FLEXENABLE LIMITED, Cambridge (GB)

( * ) Notice: Subject to any disclaimer, the term of this patent is extended or adjusted under 35 U.S.C. 154(b) by 0 days.

(21) Appl. No.: 16/300,090

(22) PCT Filed: May 11, 2017

(86) PCT No.: PCT/EP2017/061319
§ 371 (c)(1),
(2) Date: Nov. 9, 2018

(87) PCT Pub. No.: WO2017/194672
PCT Pub. Date: Nov. 16, 2017

(65) Prior Publication Data
US 2019/0148417 A1 May 16, 2019

(30) Foreign Application Priority Data
May 11, 2016 (GB) .................................. 1608279.4

(51) Int. Cl.
H01L 27/12 (2006.01)
H01L 21/683 (2006.01)
(Continued)

(52) U.S. Cl.
CPC ...... *H01L 27/1266* (2013.01); *B32B 37/0015* (2013.01); *H01L 21/6835* (2013.01);
(Continued)

(58) Field of Classification Search
None
See application file for complete search history.

(56) References Cited

U.S. PATENT DOCUMENTS

2005/0173051 A1 8/2005 Hatai et al.
2013/0306231 A1* 11/2013 Tanaka .............. G02F 1/133305
156/247
2016/0035764 A1 2/2016 Watts

FOREIGN PATENT DOCUMENTS

JP 2004-182836 A 7/2004

OTHER PUBLICATIONS

International Search Report of PCT/EP2017/061319 dated Sep. 1, 2017 [PCT/ISA/210].
(Continued)

*Primary Examiner* — Asok K Sarkar
(74) *Attorney, Agent, or Firm* — Sughrue Mion, PLLC

(57) ABSTRACT

A technique comprising: providing an assembly temporarily adhered on opposite sides to respective carriers by respective adhesive elements, the assembly including at least one plastic support sheet; heating the assembly while mechanically compressing the assembly between the carriers, wherein the strength of adhesion of one of said adhesive elements to the respective carrier and/or to the assembly is partially reduced during said heating of the assembly under mechanical compression; and wherein the strength of adhesion of the said adhesive element to the carrier and/or to the assembly is further reducible by further heating the said adhesive element after partially or completely relaxing the pressure at which the assembly is mechanically compressed between the two carriers.

16 Claims, 2 Drawing Sheets

Figure 1A:
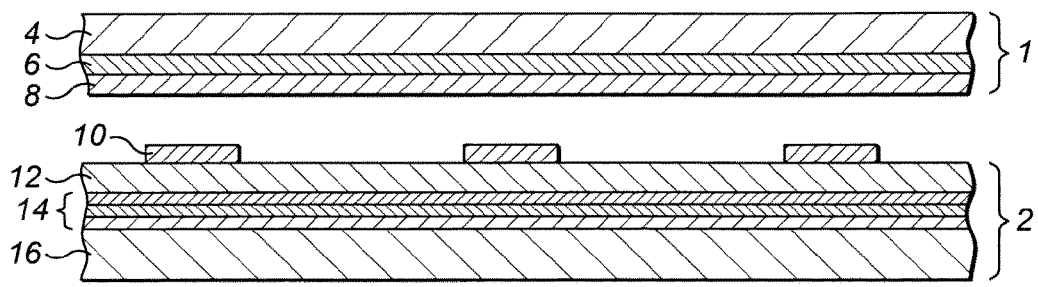
Figure 1B:
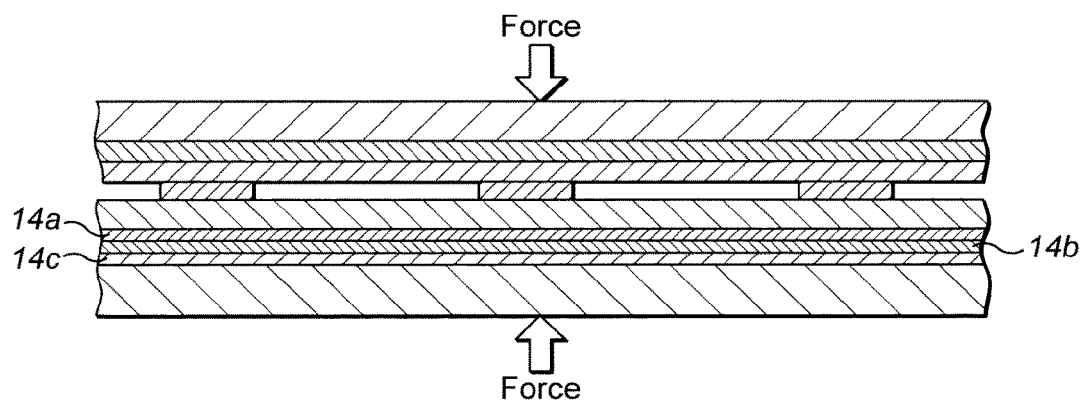

(51) Int. Cl.
*B32B 37/00* (2006.01)
*H01L 29/786* (2006.01)
*B32B 37/06* (2006.01)
*B32B 37/08* (2006.01)
*B32B 38/10* (2006.01)
*B32B 38/18* (2006.01)
*B32B 37/12* (2006.01)

(52) U.S. Cl.
CPC ........ *H01L 29/78603* (2013.01); *B32B 37/06* (2013.01); *B32B 37/08* (2013.01); *B32B 38/10* (2013.01); *B32B 38/1841* (2013.01); *B32B 2037/1253* (2013.01); *B32B 2250/05* (2013.01); *B32B 2266/00* (2013.01); *B32B 2307/304* (2013.01); *B32B 2307/31* (2013.01); *B32B 2307/412* (2013.01); *B32B 2307/748* (2013.01); *B32B 2309/025* (2013.01); *B32B 2457/00* (2013.01); *B32B 2457/14* (2013.01); *B32B 2457/20* (2013.01); *B32B 2457/202* (2013.01); *B32B 2457/206* (2013.01); *H01L 2221/6835* (2013.01); *H01L 2221/68381* (2013.01)

(56) References Cited

OTHER PUBLICATIONS

Written Opinion of PCT/EP2017/061319 dated Sep. 1, 2017 [PCT/ISA/237].
British Search Report of GB1608279.4 dated Sep. 27, 2016.

* cited by examiner

CARRIER RELEASE

CROSS REFERENCE TO RELATED APPLICATIONS

This application is a National Stage of International Application No. PCT/EP2017/061319, filed May 11, 2017, claiming priority based on British Patent Application No. 1608279.4, filed May 11, 2016.

The processing of an assembly may comprise temporarily supporting the assembly between two carriers releasably adhered to the assembly.

The inventors for the present application have worked on techniques for improving the release of the carriers from the assembly after processing of the assembly.

There is hereby provided a method comprising: providing an assembly temporarily adhered on opposite sides to respective carriers by respective adhesive elements, the assembly including at least one plastic support sheet; heating the assembly while mechanically compressing the assembly between the carriers, wherein the strength of adhesion of one of said adhesive elements to the respective carrier and/or to the assembly is partially reduced during said heating of the assembly under mechanical compression; and wherein the strength of adhesion of the said adhesive element to the carrier and/or to the assembly is further reducible by further heating the said adhesive element after partially or completely relaxing the pressure at which the assembly is mechanically compressed between the two carriers.

According to one embodiment, the method further comprises: after partially or completely relaxing the pressure at which the assembly is mechanically compressed between the two carriers, further heating the adhesive element to further reduce the strength of adhesion of the adhesive element to the carrier and/or to the assembly, and release the adhesive element from the carrier and/or the assembly.

According to one embodiment: partially reducing the strength of adhesion of the adhesive element to the carrier and/or to the assembly while mechanically compressing the assembly between the carriers comprises: generating pockets of gas where the adhesive element contacts the carrier and/or assembly thereby reducing the area of contact between solid material of the adhesive element and the carrier and/or assembly; and wherein further reducing the strength of adhesion between said at least one adhesive element and the carrier and/or assembly comprises: thermally expanding the solid material of the adhesive element to break contact between the solid material of the adhesive element and the carrier and/or assembly in locations between said gas pockets.

According to one embodiment, the method further comprises comprising releasing one of the carrier and the assembly from the adhesive element without releasing the other of the carrier and assembly from the adhesive element.

According to one embodiment, the assembly comprises a liquid crystal display component including two plastic support sheets and spacers for creating a space for receiving liquid crystal material between the two plastic support sheets.

According to one embodiment, said assembly comprises two plastic support sheets, and said carriers are used to support respective ones of the plastic support sheets during a process of laminating said two support sheets together to form said assembly.

According to one embodiment, the adhesive element on at least one side of the assembly comprises a support sheet and two adhesive layers supported on opposite sides of the support sheet.

According to one embodiment, the assembly comprises a plastic support sheet supporting a stack of conductor, semiconductor and insulator layers defining an active matrix array of TFTs.

According to one embodiment, the method further comprises: releasing one of said carriers from the assembly without releasing the other of said carriers from the assembly, and thereafter peeling the assembly from the other of said carriers.

According to one embodiment, said heating to partially reduce the strength of adhesion also comprises curing an adhesive included within the assembly.

According to one embodiment, heating said adhesive element to partially reduce the adhesion strength comprises establishing a temperature gradient across the said adhesive element and assembly that is smaller than the smallest temperature gradient established across the said adhesive element and assembly during further heating said adhesive element to further reduce the strength of adhesion.

According to one embodiment, the method further comprises: after said heating while mechanically compressing the assembly between the carriers, cooling the assembly while continuing to mechanically compress the assembly between the carriers; wherein the strength of adhesion of one of said adhesive elements to the respective carrier and/or to the assembly is partially reduced during said heating and/or cooling of the assembly under mechanical compression; and wherein the strength of adhesion of the said adhesive element to the carrier and/or to the assembly is further reducible by further heating the said adhesive element after partially or completely relaxing the pressure at which the assembly is mechanically compressed between the two carriers.

There is also hereby provided a method, comprising: providing an assembly temporarily adhered on opposite sides to respective carriers by respective adhesive elements, the assembly including at least one plastic support sheet; heating said assembly and said adhesive elements under conditions at which gas is generated within at least one of the adhesive elements, while compressing the assembly between the carriers at a pressure at which crinkling of said plastic support sheet by said heating is prevented, while retaining pockets of the generated gas at the interface between the carrier and the at least one adhesive element and/or the interface between the assembly and the at least one adhesive element.

According to one embodiment, said heating is done under conditions for curing an adhesive included within the assembly, and said gas pockets remain at said interface(s) when said curing of said adhesive is complete.

According to one embodiment, the method further comprises: after at least partially relaxing the pressure at which the assembly is compressed between the two carriers, further heating the at least one adhesive element to reduce the strength of adhesion between (i) the carrier and/or assembly and (ii) solid material of the at least one adhesive element in locations around said gas pockets.

According to one embodiment, the method further comprises comprising cooling said assembly and adhesive elements while continuing to mechanically compress the assembly between the two carriers, before at least partially relaxing the pressure at which the assembly is mechanically compressed between the two carriers and further heating the at least one adhesive element to further reduce the strength of adhesion between the carrier and/or assembly and solid material of the at least one adhesive element in locations around said gas pockets.

There is also hereby provided a method, comprising: providing an assembly temporarily adhered on opposite sides to respective carriers by respective adhesive elements, the assembly including at least one plastic support sheet; heating said assembly to completely cure an adhesive included within said assembly, wherein an adhesion strength of least one of said adhesive elements to the adjacent carrier and/or assembly is partially reduced during said heating, and is further reducible by further heating after completely curing said adhesive included within said assembly.

According to one embodiment, said adhesion strength of said at least one adhesive element to the adjacent carrier and/or assembly is further reducible by first cooling and then further heating after completely curing said adhesive included within said assembly.

According to one embodiment, said adhesive included within said assembly secures two components together within said assembly.

Figure 1C:
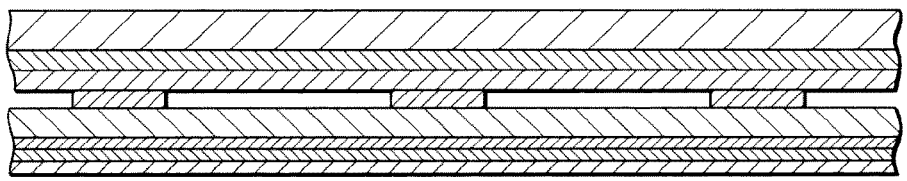
Figure 1D:
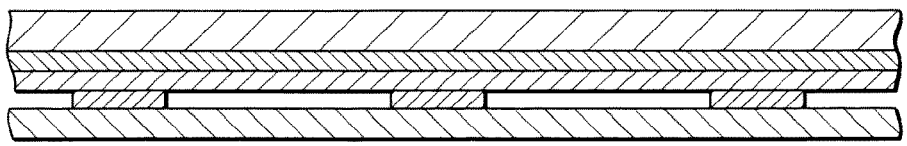
Figure 1E:
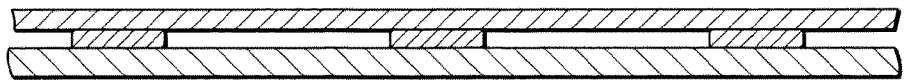
Figure 2:
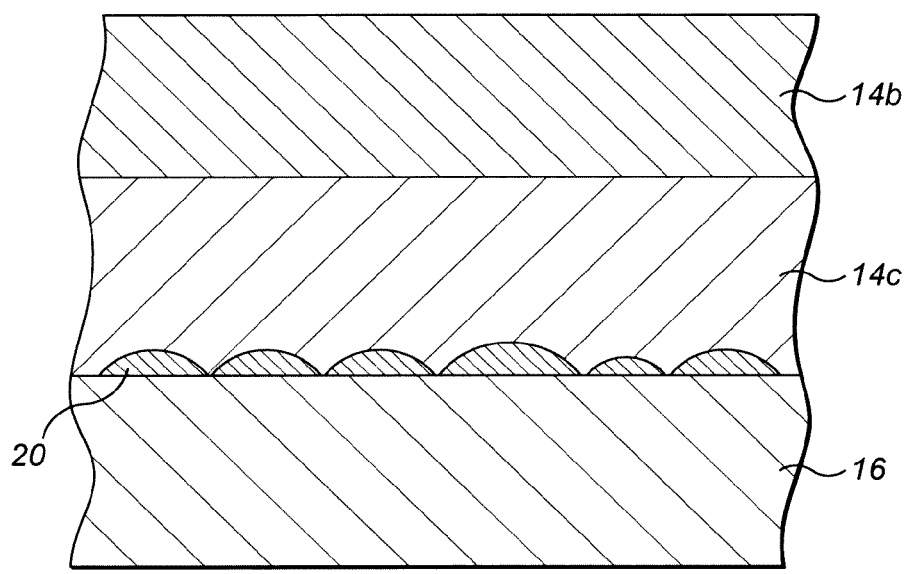

Embodiments of the invention are described hereunder, by way of example only, with reference to the accompanying drawings, in which:

FIGS. 1A to 1E illustrate an example of a technique according to an embodiment of the invention; and FIG. 2 illustrates an example of a process by which an adhesive layer is released from a carrier.

The following description is for the example of laminating two sheet components to form an assembly providing a lateral array of liquid crystal display (LCD) devices, but the same technique is equally applicable to the lamination of components to form an assembly providing a single LCD device or one or more other types of devices, such as e.g. one or more encapsulated organic light-emitting device (OLED) displays comprising pixels of organic light-emissive material whose light emission is controlled by an active matrix array.

With reference to FIGS. 1A to 1E, a first flexible component 8 is releasably secured to a rigid carrier 4 via an adhesive element 6, whose strength of adhesion to both the rigid carrier 4 and the flexible component is sufficiently high during processing of the assembly to resist excessive thermal expansion of the flexible component 8, but which either is (i) not too high to prevent peeling of the adhesive element 6 away from at least the assembly after processing or (ii) can be reduced after processing of the assembly to facilitate release of the adhesive element 6 from at least the assembly. For example, this adhesive element 6 may be a single layer of pressure-sensitive adhesive, or a single layer of adhesive whose adhesion strength to one or more of the first flexible component 8 and rigid carrier 4 can be reduced by increasing temperature (heat release), by reducing temperature (cold release) or by exposure to UV radiation (UV release). The adhesive element 6 may also comprise two layers of adhesive on opposite sides of a support film, which two layers may, for example, comprise any combination of a pressure-sensitive adhesive, a heat release adhesive, cold release adhesive and UV release adhesive.

In this example, the first flexible component 8 comprises a plastic support film which supports an alignment film for controlling the orientation of the liquid crystal molecules in a part of the liquid crystal material immediately adjacent to the alignment film, and may also support one or more further components such as a common electrode for the array of (LCD) devices, if the LCD devices are of a type that operate by generating an electric field in the liquid crystal material by means of electrodes on opposite sides of the liquid crystal material.

A second flexible component 12 is releasably secured to another rigid carrier 16 via a dual-sided adhesive unit 14 comprising a support film 14b supporting a layer of heat-release adhesive 14c adjacent to the carrier 16 and a second layer of adhesive 14a adjacent to the flexible component 12. In this example, the second layer of adhesive 14a is one whose strength of adhesion to the second flexible component 12 is sufficiently high during processing of the assembly to resist excessive thermal expansion of the assembly, but which either (i) is not too high to prevent peeling of the adhesive element away from the assembly after processing or (ii) can be reduced after processing of the assembly to facilitate release of the adhesive element 14a from the assembly. The second layer of adhesive 14a may, for example, comprise (a) a pressure-sensitive adhesive, (b) a layer of heat-release adhesive having a higher release temperature than the first layer of adhesive 14c, (c) a layer of cold-release adhesive, or (d) a layer of UV-release adhesive. The second flexible component 12 may comprise a plastic support film supporting: (i) a stack of conductor, semiconductor and insulator/dielectric layers defining respective sets of active matrix circuitry for the array of LCD devices for controlling the electric field within the liquid crystal medium, and (ii) spacer structures 10 for creating a space between the first and second flexible components 8, 12 for receiving liquid crystal material for the array of LCD devices. The plastic support film of the second flexible component 12 may be releasably secured to the carrier 16 before formation of the above-mentioned active-matrix stack of layers and spacer structures on the plastic support film. In other words, the carrier 16 may be used to support the plastic support film during the formation of said components on the plastic support film to produce the second flexible component 12, and the adhesive element 14 then functions to resist excessive thermal distortion of the plastic support film during the heating steps used for the formation of said components on the plastic support film; and/or restore the plastic support film to its original position on the carrier 16 when the plastic support film is cooled after a heating step.

In this example, at least one of the flexible components 8, 12 is provided with a heat-curable adhesive for securing the two flexible components together. The two flexible components 8, 12 are then aligned to one another (e.g. means of alignment marks included as part of the second flexible component and observable from above via the optically transparent carrier (e.g. glass) 4, optically transparent adhesive element 6, and optically transparent first flexible component 8) and mechanically compressed together (FIG. 1B) between the carriers 4, 16. While under mechanical compression, the assembly (and carriers 4, 16) are uniformly heated in an oven (so as to establish a zero temperature gradient across the assembly) under conditions at which the adhesive between the two flexible components 8, 12 of the assembly becomes completely cured. Whether or not the adhesive between the two flexible components is completely cured can, for example, be determined by subjecting the assembly to a peel strength test and comparing the measured peel strength against a known or pre-determined maximum peel strength for the specific adhesive being used. Also, where the uncured form of the adhesive has a damaging effect on e.g. liquid crystal material to be contained within the assembly between the two flexible components, the existence of uncured adhesive (i.e. a failure to completely cure the adhesive) manifests itself as a degradation in the performance of the liquid crystal display device.

This heating may involve raising the temperature of the oven in a series of steps, and maintaining the oven at each step temperature for a respective period of time. The heating required to cure the adhesive involves raising the temperature of the assembly to a temperature where crinkling of the plastic support films within the assembly tends to occur, but as discussed below, the pressure at which the assembly is mechanically compressed between the carriers is sufficiently high to substantially prevent any significant crinkling.

After sufficient heating has been performed to completely cure the adhesive between the two flexible components 8, 12, the temperature of the oven is reduced and the assembly and carriers inside the oven are allowed to cool, while continuing to mechanically compress the assembly between the two carriers to prevent crinkling of the plastic films during the cooling process. In this example, the adhesives used for the adhesive element 6 (between the first flexible component and the rigid carrier 4) and the adhesive used for adhesive layer 14a all retain their strength of adhesion to the assembly/carrier during the heating process to completely cure the adhesive between the two flexible components 8, 12. On the other hand, the heat-release adhesive for adhesive layer 14c is a material at which gas is generated during the process of heating the assembly to cure the adhesive between the two flexible components 8, 12. As described below, the generated gas forms pockets of gas at the interface of the adhesive layer 14c with the rigid carrier 16, and the formation of these gas pockets serves to partially reduce the strength of adhesion between the adhesive layer 14c and the carrier 16. The pressure at which the assembly is compressed between the two carriers 4, 16 is both (i) sufficiently low to retain the gas generated in the adhesive layer 14c as pockets of gas at the interface between the adhesive layer 14c and the carrier 16 (i.e. to prevent gas generated within the adhesive layer 14c from being expelled laterally out from between the adhesive layer 14c and the carrier 16, but (ii) sufficiently high to prevent crinkling (distortion out of the plane) of the plastic support films within the assembly during the process of heating the assembly to cure the adhesive between the two flexible components.

The generation of gas within the adhesive layer 14c and the retention of generated gas at the interface of the adhesive layer 14c with the carrier 16 can be detected by: performing the heating in a vacuum and monitoring changes in pressure within the vacuum chamber; and/or remotely analysing, by e.g. spectroscopy, the interface between the adhesive layer 14c and the carrier 16.

After cooling the assembly to a temperature at which the plastic support films within the assembly no longer tend to crinkle (during which cooling, the gas pockets continue to be retained at the interface of the adhesive layer 14c with the rigid carrier 16), mechanical compression of the assembly between the carriers is ended, and the combination of assembly and carriers 4, 16 is placed on a hotplate with the carrier 16 adjacent to adhesive layer 14c closest to the surface of the hotplate, such that a temperature gradient is established across the combination of adhesive element 14 and assembly. Without mechanically compressing the assembly between the carriers 4, 16, the hotplate is used to raise the temperature of the adhesive layer 14c to a temperature at which, in the absence of mechanical compression, the adhesive layer 14c thermally expands to an extent sufficient to further reduce the strength of adhesion between the adhesive layer 14c and the rigid carrier 16. This further heating of the adhesive layer 14c is done without increasing the temperature of the assembly to a temperature at which significant crinkling of the plastic support films within the assembly tends to occur. In one example, the temperature to which the adhesive layer 14c is raised may be above the maximum temperature that it reached during the heating process for curing the adhesive between the two flexible components 8, 12. However, release of the carrier 16 during this second heating stage can also be achieved at lower temperatures. The thermal expansion of the adhesive layer 14 during this second heating stage reduces the strength of adhesion between the adhesive material and the carrier 16 in the areas of contact around the gas pockets at the interface between the carrier 16 and the adhesive layer 14c; and this further reduction in the strength of adhesion between the carrier and the adhesive layer 14c allows the carrier to be released from the assembly without the application of mechanical force or with the application of only minimal mechanical force (FIG. 1C).

The release of one rigid carrier 16 facilitates the peeling of the whole adhesive unit 14 from the assembly (FIG. 1D) and the subsequent peeling of the assembly away from adhesive unit 6 (FIG. 1D).

The liquid crystal material for the lateral array of liquid crystal devices may be dispensed onto the lower flexible component 12 before lamination of the two flexible components 8, 12, or it may be injected into the space created by the spacer structures after lamination and curing of the adhesive between the two flexible components 8, 12.

By way of example: an adhesive product acquired from Nitto Denko Corporation and identified by product name RAU-5HD1.SS was used for one of the adhesive units 14 in the technique described above; and an adhesive product acquired from Nitta Corporation and identified by product name CX2325CA3 was used for the other adhesive unit 6 in the technique described above. The adhesive product identified by product name RAU-5HD1.SS comprises a heat-release adhesive and a UV-release adhesive on opposite sides of a flexible support film, and the adhesive product identified by product name CX2325CA3 comprises a cold-release adhesive and a pressure sensitive adhesive supported on opposite sides of a flexible support film.

In the above-described example, the adhesive layer 14c adjacent to the carrier is the layer whose strength of adhesion to an adjacent element is partially reduced under mechanical compression during the heating process to cure the adhesive between the two carriers, and further reduced (without mechanical compression) after completion of the heating process to cure the adhesive between the two carriers. However, in an alternative example, this layer may be the adhesive layer 14a adjacent to the assembly in the adhesive unit 14 (whereby the adhesive unit 14 is first released from the assembly), or this layer may be a single layer of adhesive in contact with both the assembly and the carrier.

In the example described above, a heat-curable adhesive is used to secure the two flexible components together, but (a) an adhesive curable by exposure to e.g. UV radiation (UV-curable adhesive), (b) pressure-sensitive adhesive, or (c) an adhesive curable by laser, are other examples of adhesives that may be used to secure the two flexible components together. Even when the application of heat is not required to secure the two flexible components together, heating the assembly to a temperature at which crinkling of the plastic support films within the assembly tends to occur may be used for other purposes; and the above-described technique is equally useful in such situations.

In the example described above, the technique is used in the production of an array of liquid crystal display devices, but the same technique can be used in the production of other devices, such as e.g. the production of active matrix OLED displays for which the organic light-emissive elements require encapsulation between moisture and oxygen barrier elements.

The above-described technique can be used to produce an assembly without significant crinkling of the plastic support films of either of the flexible components, even when the flexible components have a relatively large area.

In addition to any modifications explicitly mentioned above, it will be evident to a person skilled in the art that various other modifications of the described embodiment may be made within the scope of the invention.

The invention claimed is:

1. A method comprising:
   providing an assembly temporarily adhered on at least one side to at least one carrier by an adhesive element, the assembly including at least one plastic support sheet; and
   heating the assembly while mechanically compressing the assembly and the adhesive element,
   wherein the strength of adhesion of at least said adhesive element to the carrier and/or to the assembly is partially reduced during said heating of the assembly and adhesive element under mechanical compression, and
   wherein the strength of adhesion of the said adhesive element to the carrier and/or to the assembly is further reducible by further heating the said adhesive element after partially or completely relaxing the pressure at which the assembly and adhesive element is mechanically compressed.

2. The method according to claim 1, further comprising:
   after partially or completely relaxing the pressure at which the assembly and adhesive element is mechanically compressed, further heating the adhesive element to further reduce the strength of adhesion of the adhesive element to the carrier and/or to the assembly, and release the adhesive element from the carrier and/or the assembly.

3. The method according to claim 1, wherein partially reducing the strength of adhesion of the adhesive element to the carrier and/or to the assembly while mechanically compressing the assembly and adhesive element comprises:
   generating pockets of gas where the adhesive element contacts the carrier and/or assembly thereby reducing the area of contact between solid material of the adhesive element and the carrier and/or assembly,
   wherein further reducing the strength of adhesion between said at least one adhesive element and the carrier and/or assembly comprises: thermally expanding the solid material of the adhesive element to break contact between the solid material of the adhesive element and the carrier and/or assembly in locations between said gas pockets.

4. The method according to claim 1, comprising releasing one of the carrier and the assembly from the adhesive element without releasing the other of the carrier and assembly from the adhesive element.

5. The method according to claim 1, wherein the assembly comprises a liquid crystal display component including two plastic support sheets and spacers for creating a space for receiving liquid crystal material between the two plastic support sheets.

6. The method according to claim 1, wherein said assembly comprises two plastic support sheets, and respective carriers are used to support respective ones of the plastic support sheets during a process of laminating said two support sheets together to form said assembly.

7. The method according to claim 1, wherein the adhesive element comprises a support sheet and two adhesive layers supported on opposite sides of the support sheet.

8. The method according to claim 1, wherein the assembly comprises a plastic support sheet supporting a stack of conductor, semiconductor and insulator layers defining an active matrix array of TFTs.

9. The method according to claim 1, further comprising:
   releasing one of said carriers from the assembly without releasing the other of said carriers from the assembly, and
   thereafter peeling the assembly from the other of said carriers.

10. The method according to claim 1, wherein said heating to partially reduce the strength of adhesion also comprises curing an adhesive included within the assembly.

11. A method according to claim 1, wherein heating said adhesive element to partially reduce the adhesion strength comprises establishing a temperature gradient across the said adhesive element and assembly that is smaller than the smallest temperature gradient established across the said adhesive element and assembly during further heating said adhesive element to further reduce the strength of adhesion.

12. The method according to claim 1, comprising:
   after said heating while mechanically compressing the assembly and adhesive element, cooling the assembly while continuing to mechanically compress the assembly and adhesive element,
   wherein the strength of adhesion of said adhesive element to the respective carrier and/or to the assembly is partially reduced during said heating and/or cooling of the assembly and adhesive element under mechanical compression; and
   wherein the strength of adhesion of the said adhesive element to the carrier and/or to the assembly is further reducible by further heating the said adhesive element after partially or completely relaxing the pressure at which the assembly and adhesive element is mechanically compressed.

13. A method, comprising:
   providing an assembly temporarily adhered on at least one side to a carrier by an adhesive element, the assembly including at least one plastic support sheet; and
   heating said assembly and said adhesive element under conditions at which gas is generated within the adhesive element, while compressing the assembly and adhesive element at a pressure at which crinkling of said plastic support sheet by said heating is prevented, while retaining pockets of the generated gas at the interface between the carrier and the adhesive element and/or the interface between the assembly and the at least one adhesive element.

14. The method according to claim 13,
   wherein said heating is done under conditions for curing an adhesive included within the assembly, and
   wherein said gas pockets remain at said interface(s) when said curing of said adhesive is complete.

15. The method according to claim 13, further comprising:
   after at least partially relaxing the pressure at which the assembly and adhesive element is compressed, further heating the at least one adhesive element to reduce the strength of adhesion between (i) the carrier and/or assembly and (ii) solid material of the at least one adhesive element in locations around said gas pockets.

16. The method according to claim 15, further comprising cooling said assembly and adhesive element while continuing to mechanically compress the assembly and adhesive element, before at least partially relaxing the pressure at which the assembly and adhesive element is mechanically compressed and further heating the adhesive element to further reduce the strength of adhesion between the carrier and/or assembly and solid material of the at least one adhesive element in locations around said gas pockets.

* * * * *